United States Patent
Wang et al.

(10) Patent No.: US 6,660,125 B2
(45) Date of Patent: Dec. 9, 2003

(54) SPUTTER PM PROCEDURES WITH POLISH TOOL TO EFFECTIVELY REMOVE METAL DEFECTS FROM TARGET SURFACE NODULES (RESIDUE)

(75) Inventors: Ming-Tsong Wang, Taipei (TW); Chung-En Kao, Miau Lih (TW); Kuang-Hsing Liu, Hsin-Chu (TW); Ta-Bin Chen, San Chueng (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 53 days.

(21) Appl. No.: 10/029,623

(22) Filed: Dec. 31, 2001

(65) Prior Publication Data

US 2002/0127861 A1 Sep. 12, 2002

Related U.S. Application Data

(62) Division of application No. 09/542,806, filed on Apr. 4, 2000, now Pat. No. 6,358,851.

(51) Int. Cl.⁷ .................................................. B24B 7/00
(52) U.S. Cl. .................................. 156/345.12; 451/541
(58) Field of Search ....................... 451/541; 156/345.12

(56) References Cited

U.S. PATENT DOCUMENTS

| | | | | |
|---|---|---|---|---|
| 4,587,765 A | * | 5/1986 | Matsui | 451/28 |
| 4,852,304 A | * | 8/1989 | Honda et al. | 451/70 |
| 5,458,529 A | * | 10/1995 | Hasegawa et al. | 451/177 |
| 5,476,413 A | * | 12/1995 | Hasegawa et al. | 451/168 |
| 5,681,209 A | * | 10/1997 | Naumann et al. | 451/51 |
| 5,953,827 A | | 9/1999 | Or et al. | 34/58 |
| 5,976,334 A | | 11/1999 | Fu et al. | 204/298.19 |
| 5,993,916 A | | 11/1999 | Zhao et al. | 427/535 |

\* cited by examiner

*Primary Examiner*—Gregory Mills
*Assistant Examiner*—Sylvia R. MacArthur
(74) *Attorney, Agent, or Firm*—George O. Saile; Stephen B. Ackerman

(57) ABSTRACT

A new method is provided for the removal of metal residue or nodules from surfaces that are target surfaces during the process of metal sputtering. A polishing bit is applied in a rotating manner to a surface on which nodules have been formed, this application removes the nodules from the target surface and prepares the surface for further processing steps.

5 Claims, 2 Drawing Sheets

SPUTTER PM PROCEDURES WITH POLISH TOOL TO EFFECTIVELY REMOVE METAL DEFECTS FROM TARGET SURFACE NODULES (RESIDUE)

This is a division of patent application Ser. No. 09/542,806, filing date May 4, 2000, U.S. Pat. No. 6,358,851 Novel Sputter Pm Procedures With Polish Tool To Effectively Remove Metal Defects From Target Surface Nodules (Residue), assigned to the same assignee as the present invention.

BACKGROUND OF THE INVENTION (1) Field of the Invention

The invention relates to the fabrication of integrated circuit devices, and more particularly, to a method to remove nodules or re-sputter residue from processed surfaces.

(2) Description of the Prior Art

Continued improvement in semiconductor device performance has led to the technical discipline of high density interconnect technology whereby multilayer structures on a substrate are fabricated to interconnect integrated circuits. To achieve the required high wiring and the high packaging density, it is frequently necessary to fabricate a multilayer structure on the substrate thereby connecting integrated circuits to one another. Device reliability and performance require that conductor features are narrow in width and thick in a vertical direction (in the range of 5 to 10 microns thick). Since conductive patterns are typically patterned using microlithography, it is important to produce patterned layers that are substantially flat and smooth with good planarity that can serve as the base for overlying layers.

If a surface that is used in a multilayer structure is not flat and smooth, many fabrication problems occur. In a multilayer structure, a flat surface is extremely important to maintain uniform processing parameters from layer to layer. A non-flat surface results in photoresist thickness variations that require pattern or layer dependent processing conditions. The layer dependent processing greatly increases the problem complexity and leads to line width variation and reduced yield. Thus, in fabricating multilayer structures, maintaining a flat surface after fabricating each layer allows uniform layer-to-layer processing.

It is not only the topographic characteristics of the participating surfaces that determine device yield and ultimately device cost. Any deviation from the desired characteristics of metal deposition and interconnect line patterning contributes undesirable yield detractors. This to the point where the performance of interconnect patterns can have an overriding impact on device performance. This applies particularly to device reliability, product yields and device performance.

The most frequently metal for the formation of interconnect lines has been aluminum, this for applications where line density is limited. Where pure aluminum is used for this purpose, aluminum tends to absorb silicon atoms from the underlying silicon substrate, these combined particles cause spiking of the aluminum surface resulting in severe problems of reliability. Pure aluminum has therefore been replaced with aluminum to which minute traces of other metals, such as silicon, have been added. This results in a reduction in the occurrence of spiking and is therefore frequently applied. This approach however only lends itself to applications where the temperature during the device fabrication does not exceed about 450 degrees C. Above this temperature the silicon that is contained in the aluminum-silicon compound separates from the compound and forms silicon residues. This separated silicon forms nodules or identifiable particles that interfere with normal device creation in an undesirable manner. These nodules for instance can collect in contact holes and, in so doing, increase the ohmic resistance of the electrical interconnects of which these contact holes are part. A nodule than is an abnormal product of epitaxial growth due to the shape of the circumferential portion and the surface grain of the semiconductor silicon substrate. The nodules cause particle defects while the device is being formed.

It is well know in the art that, during the fabrication of VLSI and ULSI semiconductor wafers, it is of critical importance to use wafers that are free of any surface $Cu^+$ or $Cu^{++}$ ions since the presence of these impurities has a direct and negative effect on device yield and throughput. It is therefore of extreme importance to use effective means for the control and removal of these impurities from the surface of the wafer since these impurities may, during further high temperature processing steps, diffuse into the wafer surface thereby substantially altering the chemical composition of the wafer. In addition, impurities can be classified as donor or acceptor dopants; these dopants will have an impact on the performance of subsequently produced semiconductor devices. Yet other impurities may cause surface dislocations or internal stacking misalignments or faults, further having a negative impact on semiconductor manufacturing yield and cost. It is therefore clear that an effective method must be available to thoroughly clean the surface of the semiconductor substrate from all impurities while this process of removal may have to be repeated at various intervals during the complete processing sequence.

The formation of nodules or any other irregular deposition of extraneous particles is therefore, in the interest of device performance, yield and reliability, to be avoided. Metal defects of the nodule kind will, if a processing step of sputter metal deposition follows the occurrence of nodules, further emphasize the negative impact of the created nodules. Impacted will for instance be such processing steps as plug barrier etching or the patterning of interconnect metal lines that have been created over the surface that contains nodules. It has been observed that the occurrence of nodules on underlying surfaces can contribute to a yield loss of around 10%. The formation of surface nodules has also been found to be dependent on the surface on which the nodules form, that is the underlying material that contributes to the formation of the nodules. These surfaces are typically called target surfaces. It has in this respect been found that target surfaces that contain TiN, Ti, CoTi and Al all contribute to the formation of nodules with the surface that contains TiN being a surface where nodule formation is most pronounced. Increased nodule formation leads to increased device manufacturing problems. Contributing factors to the formation of nodules are not only the chemical composition of the target surface but also the crystal orientation of the target surface and the strength and distribution of the electromagnetic field that is used in processing chambers such as a sputter deposition chamber.

The process of the invention provides a method whereby nodules can be removed in a simple manner from a target surface, the simplicity of the procedure of the invention makes this procedure readily applicable without elaborate steps of preparation or follow-up.

U.S. Pat. No. 5,976,334 (Fu et al.), U.S. Pat. No. 5,953,827 (Or et al.) and U.S. Pat. No. 5,993,916 (Zhoa et al.) show AMT sputter tools and methods.

SUMMARY OF THE INVENTION

A principle objective of the invention is to provide a method and procedure for the removal of metal nodules from semiconductor surfaces.

In accordance with the objectives of the invention a new method is provided for the removal of metal residue or nodules from surfaces that are target surfaces during the process of metal sputtering. A polishing bit is applied in a rotating manner to a surface on which nodules have been formed, this application removes the nodules from the target surface and prepares the surface for further processing steps.

DESCRIPTION OF THE PREFERRED EMBODIMENTS

Figure 1:
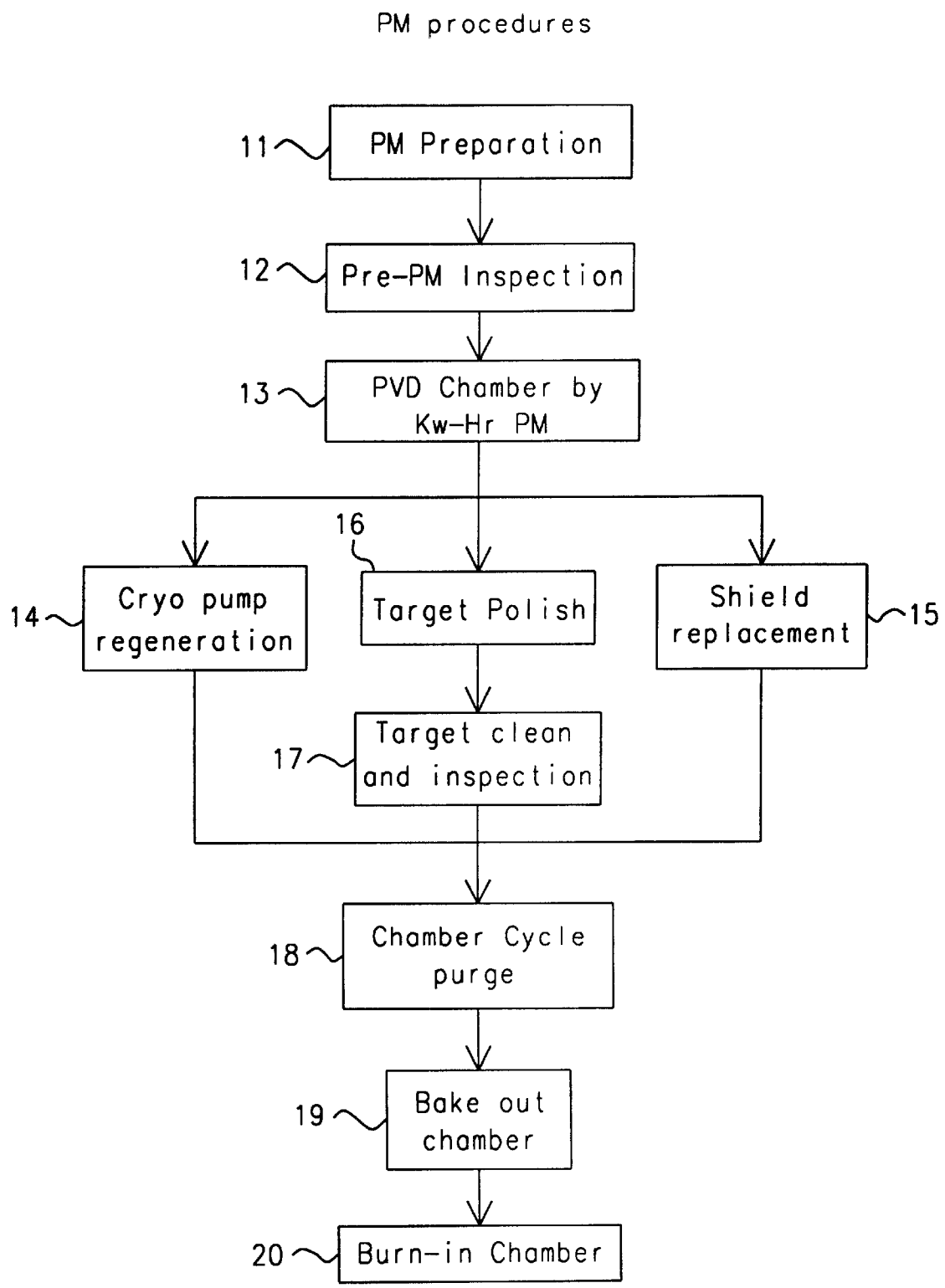
FIG. 1 provides a flow chart of a typical Preventive Maintenance (PM) environment and procedure during which the process of the invention can be applied.

Referring now to FIG. 1, there is shown a flowchart of typical Preventive Maintenance preparation and implementation procedures as they apply to a semiconductor manufacturing environment. PM procedures can be described as being steps and procedures that are applied to semiconductor manufacturing tools or any related and/or supporting tools and procedures with the objective of optimizing manufacturing conditions thereby minimizing manufacturing costs. PM procedures can be time driven whereby a PM procedure is applied after a given time interval has elapsed. PM procedures can also be event driven whereby the PM procedure is invoked driven by either an expected or unexpected event, the latter event having a negative impact on optimum manufacturing conditions. PM procedures can also be cycle driven whereby the PM procedures are invoked after a particular processing tool has executed a given number of processing steps or processing cycles. PM procedures can further be invoked as a result of un-scheduled or irregular manufacturing events such as the introduction of a new processing tool in a manufacturing line, the removal of a processing tool from a manufacturing line, the start of a long production cycle that does not lend itself to interruptions, tool updating, and the like. The above listed events that are cause for the invocation of PM procedures are not meant to be all inclusive and complete, but serve merely as a demonstration that the occurrence of PM in a semiconductor manufacturing environment is frequent and at time arbitrary, which implies that the invocation of the PM procedures must be simple and with a minimum impact on areas of manufacturing that are not subjected to these PM procedures.

The process of the invention essentially applies and is part of PM procedures that are executed for processing tools and conditions as they exist in a sputtering environment. In a sputtering process, surface atoms (which are the atoms that need to be deposited on a surface of a semiconductor substrate as a metal or conducting layer) are freed from the surface of an electrode by ion bombardment of this surface. Because the ions that cause the freeing of the atoms are aimed at the electrode, this electrode is referred to as the target. The impacting ions on the surface of the target electrode transfer momentum to the surface atoms of the target thereby freeing the atom and making the atoms available for deposition on the surface of a semiconductor. This deposition is controlled and assured by the application of a magnetic field of a given polarity and a given field strength to the free atoms. The process of sputtering of conductive layers on semiconductor surfaces is well understood and can be well controlled and can generally be applied to a range of materials such as metals, insulators, semiconductors and alloys. By biasing the target with respect to the surface on which the sputtered atoms have to be deposited, the sputtering speed can be controlled. This biasing can be RF or DC biasing. By inter-positioning a shutter between the target and the surface on which the deposition must be made, the flow of atoms to the semiconductor surface can be controlled further controlling sputtering speed and density. The process of sputtering is part of the Physical Vapor Deposition (PVD) technology, together with the technical disciplines of evaporation and molecular beam epitaxy. The atom stream that emanates from the target surface and is deposited on the semiconductor surface can also cause depositions on the surface of the chamber walls. The chamber walls can be protected by an intercepting shield that protects the chamber walls from such depositions.

The process of executing PM procedures typically starts with a sequence of preparatory steps, FIG. 1, step 11, such as the installation of a new shield and/or a new target dependent on the need for such an installation, a need that is largely determined by the functional condition of these components at the time of PM. Long-term use of the target can result in damage of the target surface, a damage that can be acute due to the nature of the application of the target. Deposits on the shield that is used to protect the chamber walls from depositions can make the shield of no use for further application in which case the shield needs to be replaced.

A second step, FIG. 1, step 12, prior to the execution of PM procedures is an examination of PM related scheduling and logistics. Questions such as is a PM procedure for a particular tool required at that time, has the tool been used for a particular number of processing cycles since the previous PM, have a given number of kilowatt-hours been expanded for a given tool (FIG. 1, step 13), are examined and answered before and as prior consideration for the invocation of PM.

The three critical components that must be monitored for the application of a sputtering process are the following:
 the composition of the gas that is contained in the sputtering chamber
 the condition of the shield that is used inside the sputtering chamber, and
 the surface condition of the target surface that is used to free atoms for deposition on a wafer surface.

After step 13, FIG. 1, has been completed and the conclusion has been reached, based on visual observation (of processing tools and/or tool components or sub-sections) or considerations of logistics or scheduling, that PM is required, this PM can take the form of the replacement and therefore the cleaning of the gasses that are contained in the sputtering chamber, FIG. 1, step 14, shield replacement, FIG. 1, step 15, or PM that addresses the surface conditions of the target surface that is used to free atoms for deposition on a wafer surface, FIG. 1, steps 16 and 17. These latter two steps form the process of the invention. If, based on visual inspection, it is concluded that nodules have been formed on the target surface such that these nodules can lead to manufacturing problems of yield or reliability, these nodules must be removed. This removal is achieved by polishing the target surface with a the polishing bit of the invention, This polishing action can be a one step process or can be applied repetitively to the point where enough nodules have been removed from the target surface and the target is judged adequately void of nodules and ready for further use.

Step 14. FIG. 1, purges that gas that is contained in the sputtering chamber and assures adequate vacuum in the chamber.

Step 15, FIG. 1, replaces the shield that is used for protection of the chamber walls from depositions.

Step 16, FIG. 1, applies the processing step of the invention of polishing the target surface using the polishing bit of the invention. The polishing bit of the invention will be further highlighted under FIGS. 2 and 3 following.

Step 17, FIG. 1, is the inspection of the target surface and confirmation or rejection of having achieved a clean surface. If a clean surface has been created, the process of the invention is considered complete and further or additional PM steps can be performed. If the target surface is, after visual inspection, considered to as yet contain an undesirable amount of surface nodules, step 16 (FIG. 1) of surface polishing can be repeated. This repetition of polishing the target surface may be performed a number of times, up to the point where the target surface is considered to be adequately free of nodules. During the process of cleaning the target surface, the target surface is, as part of standard PM procedures, cleaned (blown) with a high pressure $N_2$ stream of gas to dislodge any nodules that are present on the target surface after which dislodged nodules are removed from the chamber with the application of a low vacuum to the sputtering chamber. Isopropyl alcohol (IPA) can also be applied to the target surface with the same objective of further cleaning the target surface.

Step 18, FIG. 1, is the continuation of the PM cycle whereby the contents of the sputter chamber are purged at 300 mTorr and vented to 500 Torr, these latter two steps are normally repeated several times to remove alien particles or impurities from the chamber.

Step 19, FIG. 1 is the chamber bake-out where a bake-out lamp is applied concurrent with a chamber pump out.

Step 20, FIG. 1 is the chamber burn-in that, as a last step, prepares the sputter chamber for the resumption of its use as a sputter chamber in the creation of semiconductor devices.

Figure 2:
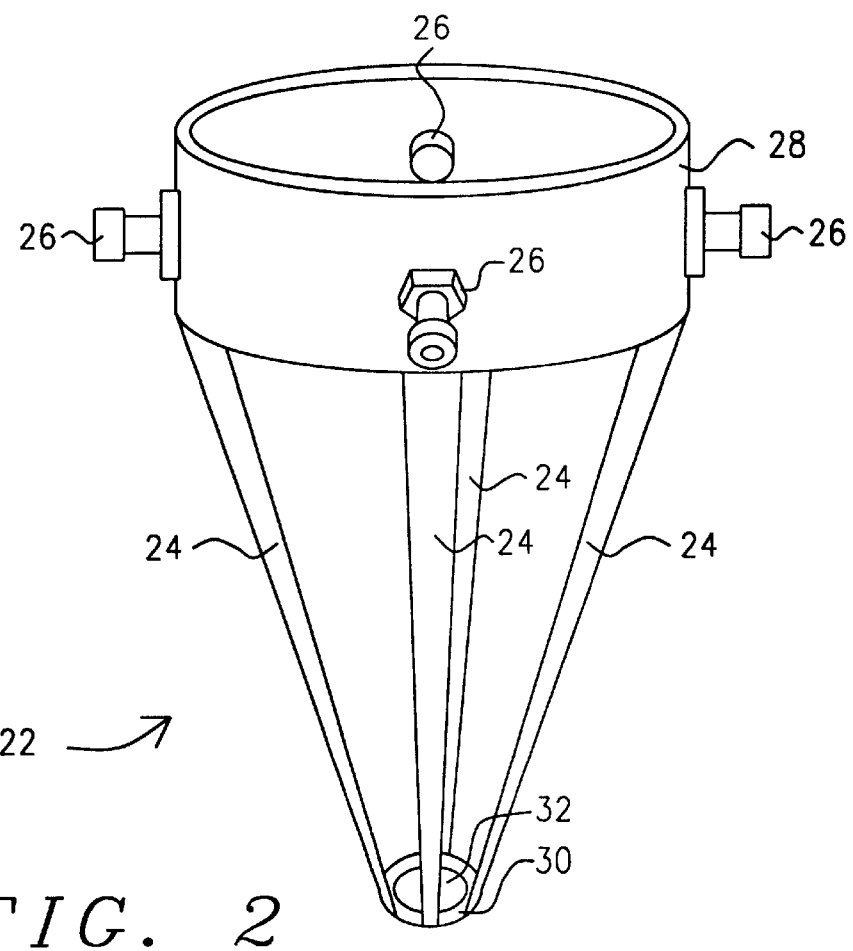
FIG. 2 shows an extended view of the polishing tool support on which the polishing bit of the invention is mounted.

Referring now to FIG. 2, there is shown an extended view of the polishing tool support 22 on which the polishing bit of the invention (not shown in FIG. 2) is mounted. The polishing tool support 22 is the mechanical interface between a motor or tool that imparts rotational motion to the polishing bit. The cylindrical structure 28 is clamped, by means of clamp bolts 26, to the outside circumference of a rotational motor (not shown in FIG. 2) whereby the axis of this motor (not shown) protrudes through the center of cylinder 28 in the direction of bit holder 30. The direction of the rotational axis (not shown in FIG. 2) coincides with the line that connects the geometric center of cylinder 28 with the geometric center of bit holder 30. Braces 24 position bit holder 30 with respect to cylinder 28, such that bit holder 30 is in a determinate and fixed position with respect to the rotational motor to which cylinder 28 is attached. The polishing bit (not shown in FIG. 2) is mounted in the central opening 32 of bit holder 30, by mechanically coupling the polishing bit to the axis of the rotational motor, the rotational motion of the motor is transferred to the polishing bit.

Figure 3:
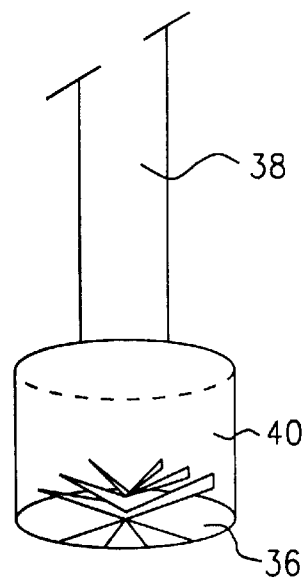
FIG. 3 shows a three dimensional view of the polishing bit of the invention.

FIG. 3 shows an extended three dimensional view of the polishing bit. The central axis 38 of the polishing bit is mechanically connected to the axis of the rotating motor that has been discussed under FIG. 2 above, the polishing surface 36 is the extremity of the central cylinder 40 of the polishing bit. The diameter of the polishing surface 36 can be selected to any suitable value dependent on and determined by the surface area of the target surface that needs to be cleaned of nodules. Surface 36 is coated with a material that provides abrasive action when this surface 36 is brought in contact with the target surface. The surface 36 must be positioned in parallel with the surface of the target while the target surface is being cleaned of nodules.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An apparatus for removing nodules from a semiconductor surface, comprising:
   a circular polishing bit having a center said polishing bit being mounted on a cylindrical polishing bit support platform having a central axis whereby said cylindrical support platform has further been provided with a shaft having a central axis whereby said polishing bit and said shaft of said polishing bit support platform are positioned at opposing ends of said cylinder of said polishing bit support platform whereby furthermore said center of said polishing bit is on a line that coincides with said axis of said cylindrical support platform which further coincides with said axis of said shaft of said cylindrical support platform; a polishing bit mounting apparatus having a central axis whereby said polishing bit mounting apparatus can contain said polishing bit in a fixed position such that said central axis of said polishing bit support platform coincides with said central axis of said polishing bit mounting apparatus;
   a rotary motor said motor having been provided with a shaft having a central axis whereby said shaft can be rotated when stimulated by said rotary motor;
   a means for positioning and mounting said polishing bit in a fixed position within said polishing bit mounting apparatus by mounting said polishing bit supporting platform in said polishing bit mounting apparatus whereby said central axis of said polishing supporting platform coincides with said central axis of said polishing bit mounting apparatus;

a means for positioning and mounting said polishing bit mounting apparatus in a fixed position with respect to said rotary motor whereby said central axis of said polishing bit mounting apparatus coincides with said central axis of said shaft of said rotary motor thereby coinciding said central axis of said polishing bit with said central axis of said shaft of said rotary motor thereby coupling said polishing bit with said shaft of said rotary motor such that any rotary motion of said shaft of said rotary motor is transferred as a rotary motion to said polishing bit;

a means for rotating said shaft of said rotary motor thereby providing a rotating motion to said polishing bit thereby enabling said polishing bit to exert an abrasive action; and a means for transferring said abrasive action of said polishing bit to said semiconductor surface thereby removing said nodules from said surface.

2. The apparatus of claim 1 wherein said polishing bit mounting apparatus contains a means for transferring rotary motion from a rotary motor to said polishing bit.

3. The apparatus of claim 1 wherein said polishing bit comprises an abrasive surface.

4. The apparatus of claim 1 wherein said semiconductor surface is any semiconductor surface that lends itself to deposition of metal thereon by a process of metal sputter.

5. The apparatus of claim 1 wherein said semiconductor surface is any metal surface that lends itself to ion bombardment thereby freeing metal from said surface said metal being deposited on a semiconductor surface by a process of metal sputter.

* * * * *